（12）United States Patent
Suzuki et al.

(10) Patent No.: US 10,669,427 B2
(45) Date of Patent: Jun. 2, 2020

(54) GAS BARRIER LAMINATE, METHOD FOR PRODUCING SAME, MEMBER FOR ELECTRONIC DEVICES, AND ELECTRONIC DEVICE

(71) Applicant: LINTEC CORPORATION, Tokyo (JP)

(72) Inventors: Yuuta Suzuki, Tokyo (JP); Koichi Nagamoto, Tokyo (JP); Takeshi Kondo, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 845 days.

(21) Appl. No.: 14/388,688

(22) PCT Filed: Mar. 28, 2013

(86) PCT No.: PCT/JP2013/059393
§ 371 (c)(1),
(2) Date: Sep. 26, 2014

(87) PCT Pub. No.: WO2013/147090
PCT Pub. Date: Oct. 3, 2013

(65) Prior Publication Data
US 2015/0099094 A1    Apr. 9, 2015

(30) Foreign Application Priority Data
Mar. 29, 2012 (JP) ................. 2012-076192

(51) Int. Cl.
*C09D 5/00* (2006.01)
*B05D 3/12* (2006.01)
(Continued)

(52) U.S. Cl.
CPC ............. *C09D 5/00* (2013.01); *B05D 3/12* (2013.01); *B32B 27/08* (2013.01); *C08J 7/042* (2013.01);
(Continued)

(58) Field of Classification Search
CPC ..... C09D 5/00; C08J 7/045; C08J 7/18; C08J 7/042; C08J 2367/02; C08J 2433/10;
(Continued)

(56) References Cited

U.S. PATENT DOCUMENTS 5,639,537 A    6/1997  Ebara et al.
2005/0029513 A1*  2/2005  Kawashima .......... C23C 14/024
                                                     257/40

(Continued)

FOREIGN PATENT DOCUMENTS

EP    0 550 011 B1    7/1993
JP    5-177795 A      7/1993
(Continued)

OTHER PUBLICATIONS

Translation to English of JP 2009-291971 A. accessed Jun. 6, 2017.*
(Continued)

*Primary Examiner* — Nancy R Johnson
(74) *Attorney, Agent, or Firm* — Birch, Stewart, Kolasch & Birch, LLP (57) ABSTRACT

The present invention provides: a gas barrier laminate comprising a base, a primer layer, and a gas barrier layer, the primer layer and the gas barrier layer being sequentially stacked on at least one side of the base, the primer layer having a modulus of elasticity at 90° C. of 1.6 GPa or more, and a coefficient of static friction between a surface of one side of the gas barrier laminate and a surface of the other side of the gas barrier laminate being 0.35 to 0.8; a method for producing the gas barrier laminate; an electronic device
(Continued)

member comprising the gas barrier laminate; and an electronic device.

16 Claims, 1 Drawing Sheet

(51) Int. Cl.
    *C23C 14/48*     (2006.01)
    *C23C 14/58*     (2006.01)
    *B32B 27/08*     (2006.01)
    *C08J 7/04*     (2020.01)
    *C08J 7/18*     (2006.01)

(52) U.S. Cl.
CPC ............... *C08J 7/0423* (2020.01); *C08J 7/18* (2013.01); *C23C 14/48* (2013.01); *C23C 14/5886* (2013.01); *B32B 2307/7244* (2013.01); *C08J 2367/02* (2013.01); *C08J 2433/08* (2013.01); *C08J 2433/10* (2013.01); *C08J 2433/12* (2013.01); *C08J 2483/04* (2013.01); *C08J 2483/16* (2013.01); *Y10T 428/24355* (2015.01)

(58) Field of Classification Search
CPC ............... C08J 2433/12; C08J 2433/08; C08J 2483/04; C08J 2483/16; C23C 14/48; Y10T 428/24355; B32B 27/08; B32B 3/30; B32B 7/00; B05D 3/12
See application file for complete search history.

(56) References Cited

U.S. PATENT DOCUMENTS

| | | | |
|---|---|---|---|
| 2009/0075003 A1* | 3/2009 | Aiba | .................... H01L 51/5253 428/36.6 |
| 2009/0098400 A1 | 4/2009 | Tateishi | |
| 2010/0238383 A1 | 9/2010 | Nakano et al. | |
| 2011/0274933 A1* | 11/2011 | Hoshi | .................... B32B 27/08 428/446 |
| 2015/0132031 A1 | 5/2015 | Hagiwara et al. | |

FOREIGN PATENT DOCUMENTS

| | | | |
|---|---|---|---|
| JP | 5-329997 | A | 12/1993 |
| JP | 6-293838 | A | 10/1994 |
| JP | 8-174741 | A | 7/1996 |
| JP | 8-225689 | A | 9/1996 |
| JP | 11-070629 | A | 3/1999 |
| JP | 2007-216504 | A | 3/1999 |
| JP | 2000-007978 | A | 1/2000 |
| JP | 3298099 | B2 | 7/2002 |
| JP | 2004-354828 | A | 12/2004 |
| JP | 2005-205824 | A | 8/2005 |
| JP | 2006-104529 | A | 4/2006 |
| JP | 2006-273544 | A | 10/2006 |
| JP | 2007-237598 | A | 9/2007 |
| JP | 2009-220277 | A | 9/2007 |
| JP | 2008-20891 | A | 1/2008 |
| JP | 2008-76858 | A | 4/2008 |
| JP | 2008-216568 | A | 9/2008 |
| JP | 2009-143074 | A | 7/2009 |
| JP | 2009-166305 | A | 7/2009 |
| JP | 2009-172988 | A | 8/2009 |
| JP | 2009-269193 | A | 11/2009 |
| JP | 2009291971 | A * | 12/2009 |
| JP | 2011-718 | A | 1/2011 |
| JP | 2011-194765 | A | 10/2011 |
| JP | 2012-24933 | A | 2/2012 |
| JP | 2013-006340 | A | 1/2013 |
| JP | 2015-94897 | A | 5/2015 |
| WO | WO 2010/067857 | A1 | 6/2010 |

OTHER PUBLICATIONS

Ivkovic et al. "The Influence of the Contact Surface Roughness on the Static Friction Coefficient." Tribology in industry, vol. 2, No. 3 &4, 2000. http://www.tribology.fink.rs/journals/2000/3-4/1.pdf. (Year: 2000).*

International Search Report issued in PCT/JP2013/059393 dated Jun. 18, 2013.

Notice of Grounds for Revocation (Opposition 2017-700445) dated Jun. 26, 2017, in Japanese Patent No. 6023174, with English translation.

* cited by examiner

GAS BARRIER LAMINATE, METHOD FOR PRODUCING SAME, MEMBER FOR ELECTRONIC DEVICES, AND ELECTRONIC DEVICE

TECHNICAL FIELD

The invention relates to a gas barrier laminate, a method for producing the same, an electronic device member that includes the gas barrier laminate, and an electronic device that includes the electronic device member.

BACKGROUND ART

In recent years, a gas barrier film in which an inorganic deposited (evaporated) layer (gas barrier layer) is stacked on a transparent plastic film has been used instead of a glass sheet as an electrode substrate for displays (e.g., liquid crystal display and electroluminescence (EL) display) in order to implement a reduction in thickness, a reduction in weight, flexibility, and the like.

However, the gas barrier film may show a deterioration in gas barrier capability due to a deterioration in the base film through thermal shrinkage when subjected to a high temperature and a high humidity for a long time.

A method that stacks the gas barrier layer on the base film through a primer layer to prevent a deterioration in gas barrier capability has been proposed to solve the above problem.

For example, Patent Document 1 discloses a gas barrier resin film in which an inorganic deposited layer (gas barrier layer), a specific adhesive layer, and a polyolefin-based resin layer are sequentially stacked on a base layer, wherein the base layer includes a polyamide-based resin layer and an anchor coat layer (primer layer), the anchor coat layer is provided to come in contact with the inorganic deposited layer, and the adhesive layer is formed of a specific thermosetting polyester resin, and the gas barrier resin film has a compressive elasticity modulus at 40° C. of 5 kgf/mm² or more. However, when using an inorganic deposited layer as the gas barrier layer, cracks may occur in the gas barrier layer, and a deterioration in gas barrier capability may occur when the gas barrier film is rolled or bent due to low flexibility.

Patent Document 2 discloses a method that forms a polysilazane film on at least one side of a film, and subjects the polysilazane film to a plasma treatment to produce a flexible gas barrier film. However, the above gas barrier film exhibits improved flexibility, but may show a deterioration in gas barrier capability through cure shrinkage of the gas barrier layer when subjected to a high temperature and a high humidity for a long time. When producing a long gas barrier film using a roll-to-roll method, winding failure such as blocking (i.e., the front surface and the back surface of the film adhere to each other) or wrinkles may occur when winding the gas barrier film.

Patent Document 3 discloses a laminate film in which a gas barrier layer and a sliding layer are sequentially stacked on a base film, and the coefficient of static friction μ between the surface of the sliding layer and stainless steel is 0.4 or less.

RELATED-ART DOCUMENT

Patent Document

Patent Document 1: Japanese Patent No. 3298099
Patent Document 2: JP-A-2007-237588
Patent Document 3: JP-A-2009-220277

SUMMARY OF THE INVENTION

Technical Problem

The invention was conceived in view of the above situation. An object of the invention is to provide a gas barrier laminate that does not show a deterioration in gas barrier capability even when subjected to a high temperature and a high humidity for a long time, and exhibits an excellent winding capability, a method for producing the same, an electronic device member that includes the gas barrier laminate, and an electronic device that includes the electronic device member.

Solution to Problem

The inventors of the invention conducted extensive studies in order to achieve the above object. As a result, the inventors found that a gas barrier laminate in which a primer layer and a gas barrier layer are sequentially stacked on at least one side of a base, the primer layer having a modulus of elasticity at 90° C. of 1.6 GPa or more, and the coefficient of static friction between the surface of one side of the laminate and the surface of the other side of the laminate being 0.35 to 0.8, exhibits an excellent gas barrier capability, excellent durability, and excellent winding capability. This finding has led to the completion of the invention.

Several aspects of the invention provides the following gas barrier laminate (see (1) to (10)), method for producing a gas barrier laminate (see (11)), electronic device member (see (12)), and electronic device (see (13)).

(1) A gas barrier laminate including a base, a primer layer, and a gas barrier layer, the primer layer and the gas barrier layer being sequentially stacked on at least one side of the base, the primer layer having a modulus of elasticity at 90° C. of 1.6 GPa or more, and a coefficient of static friction between a surface of one side of the gas barrier laminate and a surface of the other side of the gas barrier laminate being 0.35 to 0.8.
(2) The gas barrier laminate according to (1), wherein a surface of one side of the gas barrier laminate where the primer layer and the gas barrier layer are stacked has an arithmetic average roughness (Ra) of 8 nm or less and a total height (Rt) of a roughness profile of less than 150 nm, and a surface of the other side of the gas barrier laminate has an arithmetic average roughness (Ra) of 15 nm or more and a total height (Rt) of a roughness profile of 150 nm or more.
(3) The gas barrier laminate according to (1), wherein the primer layer is a layer obtained by curing at least one (meth)acrylate-based ionizing radiation-curable compound.
(4) The gas barrier laminate according to (1), wherein the primer layer has a thickness of 0.5 to 3 μm.
(5) The gas barrier laminate according to (1), wherein the gas barrier layer is a layer obtained by implanting ions into a layer of a silicon-based polymer compound.
(6) The gas barrier laminate according to (5), wherein the layer of the silicon-based polymer compound includes a polysilazane compound or a polyorganosiloxane compound.
(7) The gas barrier laminate according to (1), the gas barrier laminate being a long laminate film.
(8) The gas barrier laminate according to (1), wherein one outermost layer of the gas barrier laminate is the gas barrier layer, and the other outermost layer of the gas barrier laminate is the base.

(9) The gas barrier laminate according to (1), wherein a surface of the gas barrier layer has an arithmetic average roughness (Ra) of 8 nm or less and a total height (Rt) of a roughness profile of less than 150 nm.

(10) The gas barrier laminate according to (1), wherein a surface of the base has an arithmetic average roughness (Ra) of 15 nm or more and a total height (Rt) of a roughness profile of 150 nm or more.

(11) A method for producing the gas barrier laminate according to any one of (1) to (10), the method including:

a step (I) that forms a gas barrier layer on a primer layer while feeding a long base in a given direction, the primer layer being formed on at least one side of the base, and having a modulus of elasticity at 90° C. of 1.6 GPa or more; and a step (II) that rolls up the base on which the gas barrier layer is formed.

(12) An electronic device member including the gas barrier laminate according to any one of (1) to (10).

(13) An electronic device including the electronic device member according to (12).

Advantageous Effects of the Invention

The gas barrier laminate according to one aspect of the invention does not show a deterioration in gas barrier capability even when subjected to a high temperature and a high humidity for a long time, and exhibits an excellent gas barrier capability, excellent durability, and excellent winding capability. Therefore, the gas barrier laminate according to one aspect of the invention may suitably be used as an electronic device member for flexible displays, solar cells, and the like (e.g., solar cell back side protective sheet).

The production method according to one aspect of the invention prevents winding failure (e.g., blocking) even when rolling up a long gas barrier laminate, and can efficiently and continuously produce a long gas barrier laminate.

Since the electronic device member according to one aspect of the invention exhibits an excellent gas barrier capability and excellent durability, the electronic device member may suitably be used for electronic devices such as displays and solar cells.

DESCRIPTION OF EMBODIMENTS

A gas barrier laminate, a method for producing a gas barrier laminate, an electronic device member, and an electronic device according to several exemplary embodiments of the invention are described in detail in below.

1) Gas Barrier Laminate

A gas barrier laminate according to one embodiment of the invention includes a base, a primer layer, and a gas barrier layer, the primer layer and the gas barrier layer being sequentially stacked on at least one side of the base, the primer layer having a modulus of elasticity at 90° C. of 1.6 GPa or more, and the coefficient of static friction between the surface of one side of the gas barrier laminate and the surface of the other side of the gas barrier laminate being 0.35 to 0.8.

(1) Base

The base used for the gas barrier laminate according to one embodiment of the invention is normally in the shape of a film or a sheet. The thickness of the base is not particularly limited, and may be determined taking account of the intended use (object) of the gas barrier laminate. The thickness of the base layer is normally 0.5 to 500 μm, and preferably 1 to 100 μm.

A material for forming the base is not particularly limited as long as the material is suitable for the intended use of the gas barrier laminate according to one embodiment of the invention. When the base forms one side of the laminate (i.e., when no layer is stacked on one side of the base), it is necessary to appropriately select the material for forming the base so that the coefficient of static friction between the surface of the base and the surface of the other side of the laminate is 0.35 to 0.8 (described later). When the base forms the outermost layer of the laminate, the coefficient of static friction between the surface of the base and the surface of the other side of the laminate must be 0.35 to 0.8 (described later). Note that the surface of the base refers to the surface of the base that is situated on the outermost side of the laminate.

In this case, the coefficient of static friction is preferably adjusted within the above specific range by forming the base so that the surface of the base has an arithmetic average roughness (Ra) of 15 nm or more and a total height (Rt) of the roughness profile of 150 nm or more.

Examples of the material for forming the base include polyimides, polyamides, polyamideimides, polyphenylene ethers, polyether ketones, polyether ether ketones, polyolefins, polyesters, polycarbonates, polysulfones, polyether sulfones, polyphenylene sulfides, polyallylates, acrylic resins, cycloolefin polymers, aromatic polymers, and the like.

Among these, polyesters, polyamides, polysulfones, polyether sulfones, polyphenylene sulfides, polyallylates, and cycloolefin polymers are preferable, and polyesters and cycloolefin polymers are more preferable due to excellent transparency and versatility.

Examples of the polyesters include polyethylene terephthalate, polybuthylene terephthalate, polyethylene naphthalate, polyarylate, and the like.

Examples of the polyamides include wholly aromatic polyamides, nylon 6, nylon 66, nylon copolymers, and the like.

Examples of the cycloolefin-based polymers include norbornene-based polymers, monocyclic olefin-based polymers, cyclic conjugated diene-based polymers, vinyl alicyclic hydrocarbon-based polymers, and hydrogenated products thereof. Specific examples of the cycloolefin-based polymers include APEL (ethylene-cycloolefin copolymer manufactured by Mitsui Chemicals Inc.), ARTON (norbornene-based polymer manufactured by JSR Corporation), ZEONOR (norbornene-based polymer manufactured by Zeon Corporation), and the like.

The base may be produced by curing a mixture of the material for forming the base and an energy ray-curable compound. Examples of the energy ray-curable compound include energy ray-polymerizable monomers, energy ray-polymerizable oligomers, and the like.

(2) Primer Layer

The gas barrier laminate according to one embodiment of the invention includes the primer layer that is formed on at least one side of the base, and has a modulus of elasticity at 90° C. of 1.6 GPa or more.

The primer layer improves interlayer adhesion between the base and the gas barrier layer, and further improves the gas barrier capability.

The gas barrier layer normally easily undergoes cure shrinkage, and shows a deterioration in gas barrier capability when subjected to a high temperature and a high humidity for a long time. However, the effects of cure shrinkage can be suppressed by utilizing a primer layer having a high modulus of elasticity at a high temperature as the primer layer that comes in contact with the gas barrier layer. This makes it possible to prevent a deterioration in gas barrier capability, and improve durability.

The modulus of elasticity of the primer layer at 90° C. is preferably 1.6 GPa or more, more preferably 1.6 to 5.0 GPa, and still more preferably 2.0 to 4.0 GPa. When the modulus of elasticity of the primer layer at 90° C. is 1.6 GPa or more, it is possible to suppress a situation in which the gas barrier layer undergoes cure shrinkage, and prevent a deterioration in gas barrier capability. When the modulus of elasticity of the primer layer at 90° C. is 5.0 GPa or less, it is possible to obtain a gas barrier laminate that exhibits excellent flexibility.

The modulus of elasticity of the primer layer at 25° C. is preferably 3.2 GPa or more, and more preferably 3.2 to 5.0 GPa. A gas barrier laminate that exhibits more excellent flexibility can be obtained by utilizing the primer layer having a modulus of elasticity within the above range.

The modulus of elasticity of the primer layer at 60° C. is preferably 2.3 GPa or more, and more preferably 2.3 to 4.5 GPa. When the modulus of elasticity of the primer layer at 60° C. is within the above range, it is possible to prevent a situation in which the gas barrier shows a deterioration in gas barrier capability when subjected to a high temperature and a high humidity for a long time, and significantly improve durability.

The modulus of elasticity of the primer layer may be measured using a known method (e.g., a nanoindentation method that utilizes a nanohardness tester). Note that the modulus of elasticity of the primer layer of the gas barrier laminate according to one embodiment of the invention refers to a value measured using the method described below in connection with the examples in a state in which the primer layer is layered on the base.

A material for forming the primer layer is not particularly limited as long as the material produces a primer layer having a modulus of elasticity at 90° C. of 1.6 GPa or more, and meets the object of the invention. A known material may be used to form the primer layer. It is preferable that the material for forming the primer layer be a thermosetting compound or an ionizing radiation-curable compound, and more preferably an ionizing radiation-curable compound, since such a compound has an excellent handling capability (i.e., is not cured at a high temperature), and ensures high productivity.

The ionizing radiation-curable compound is not particularly limited as long as the ionizing radiation-curable compound is cured upon application of ionizing radiation. It is preferable to use a (meth)acrylate-based ionizing radiation-curable compound as the ionizing radiation-curable compound. Note that the term "(meth)acrylate" used herein refers to "acrylate" or "methacrylate".

Examples of the (meth)acrylate-based ionizing radiation-curable compound include (meth)acrylate-based monomers and/or prepolymers, (meth)acrylate-based resins, and the like. These (meth)acrylate-based ionizing radiation-curable compounds may be used either alone or in combination.

Examples of the (meth)acrylate-based monomers include bifunctional (meth)acrylate compounds such as 1,4-butanediol di(meth)acrylate, 1,6-hexanediol di(meth)acrylate, neopentyl glycol di(meth)acrylate, neopentyl glycol adipate di(meth)acrylate, ethylene glycol di(meth)acrylate, isocyanuric acid ethylene oxide-modified di(meth)acrylate, hydroxypivalic acid neopentyl glycol di(meth)acrylate, dicyclopentanyl di(meth)acrylate, caprolactone-modified dicyclopentenyl di(meth)acrylate, ethylene oxide-modified phosphoric acid di(meth)acrylate, and allylated cyclohexyl di(meth)acrylate; trifunctional (meth)acrylate compounds such as trimethylolpropane tri(meth)acrylate, dipentaerythritol tri(meth)acrylate, propionic acid-modified dipentaerythritol tri(meth)acrylate, pentaerythritol tri(meth)acrylate, propylene oxide-modified trimethylolpropane tri(meth)acrylate, and tris(acryloyloxyethyl)isocyanurate; tetrafunctional (meth)acrylate compounds such as diglycerol tetra(meth)acrylate and pentaerythritol tetra(meth)acrylate; pentafunctional (meth)acrylate compounds such as dipentaerythritol penta(meth)acrylate and propionic acid-modified dipentaerythritol penta(meth)acrylate; hexafunctional (meth)acrylate compounds such as dipentaerythritol hexa(meth)acrylate and caprolactone-modified dipentaerythritol hexa(meth)acrylate; and the like.

Among these, polyfunctional (meth)acrylates having 3 or more functional groups are preferable, and hexafunctional (meth)acrylate compounds are more preferable, since it is possible to easily obtain a primer layer having a modulus of elasticity within the desired range.

Examples of the (meth)acrylate-based resins include urethane (meth)acrylate-based resins, polyester (meth)acrylate-based resins, epoxy (meth)acrylate-based resins, and the like.

Examples of the urethane (meth)acrylate-based resins include resins obtained by reacting a hydroxyl group-containing (meth)acrylate-based compound, a polyisocyanate-based compound, and a polyol compound, and the like.

Examples of the hydroxyl group-containing (meth)acrylate-based compound include hydroxyalkyl(meth)acrylates such as 2-hydroxyethyl(meth)acrylate, 2-hydroxypropyl (meth)acrylate, 2-hydroxybutyl(meth)acrylate, 4-hydroxybutyl(meth)acrylate, and 6-hydroxyhexyl(meth)acrylate, 2-hydroxyethylacryloyl phosphate, 2-(meth)acryloyloxyethyl-2-hydroxypropyl phthalate, caprolactone-modified 2-hydroxyethyl(meth)acrylate, dipropylene glycol (meth)acrylate, fatty acid-modified glycidyl(meth)acrylate, polyethylene glycol mono(meth)acrylate, polypropylene glycol mono(meth)acrylate, 2-hydroxy-3-(meth)acryloyloxypropyl (meth)acrylate, glycerol di(meth)acrylate, 2-hydroxy-3-acryloyloxypropyl methacrylate, pentaerythritol tri(meth)acrylate, caprolactone-modified pentaerythritol tri(meth)acrylate, ethylene oxide-modified pentaerythritol tri(meth)acrylate, dipentaerythritol penta(meth)acrylate, caprolactone-modified dipentaerythritol penta(meth)acrylate, ethylene oxide-modified dipentaerythritol penta(meth)acrylate, and the like.

Examples of the polyisocyanate-based compound include aromatic polyisocyanates such as tolylene diisocyanate, diphenylmethane diisocyanate, polyphenylmethane polyisocyanate, modified diphenylmethane diisocyanate, xylylene diisocyanate, tetramethylxylylene diisocyanate, phenylene diisocyanate, and naphthalene diisocyanate; aliphatic polyisocyanates such as hexamethylene diisocyanate, trimethylhexamethylene diisocyanate, lysine diisocyanate, and lysine triisocyanate; alicyclic polyisocyanates such as hydrogenated diphenylmethane diisocyanate, hydrogenated xylylene diisocyanate, isophorone diisocyanate, norbornene diisocyanate, and 1,3-bis(isocyanatomethyl)cyclohexane; trimer compounds or multimer compounds of these polyisocyanates; allophanate-type polyisocyanates; biuret-type polyisocyanates; water-dispersion-type polyisocyanates (e.g., "Aquanate 100", "Aquanate 110", "Aquanate 200", and "Aquanate 210" manufactured by Nippon Polyurethane Industry Co., Ltd.); and the like.

Examples of the polyol compound include polyether polyols such as alkylene structure-containing polyether polyols such as polyethylene glycol, polypropylene glycol, polytetramethylene glycol, polybutylene glycol, and polyhexamethylene glycol; polyester polyols such as reaction products of a polyhydric alcohol such as ethylene glycol or diethylene glycol, a polycarboxylic acid such as malonic acid, maleic acid, or fumaric acid, and a cyclic ester such as propyolactone, β-methyl-δ-valerolactone, or ε-caprolactone; polycarbonate polyols such as a reaction product of a polyhydric alcohol and phosgene, and a ring-opening polymer of a cyclic carbonate ester (e.g., an alkylene carbonate such as ethylene carbonate, trimethylene carbonate, tetramethylene carbonate, or hexamethylene carbonate); polyolefin polyols such as a polyolefin polyol that includes a homopolymer or a copolymer of ethylene, propylene, butene, or the like as a saturated hydrocarbon skeleton, and includes a hydroxyl group at the molecular terminal; polybutadiene polyols such as a polybutadiene polyol that includes a copolymer of butadiene as a hydrocarbon skeleton, and includes a hydroxyl group at the molecular terminal; (meth) acrylic polyols such as a (meth)acrylic polyol that includes at least two hydroxyl groups in the molecule of a polymer or a copolymer of a (meth)acrylate such as methyl(meth) acrylate, ethyl(meth)acrylate, propyl(meth)acrylate, butyl (meth)acrylate, or 2-ethylhexyl(meth)acrylate; polysiloxane polyols such as a dimethylpolysiloxane polyol and a methylphenylpolysiloxane polyol; and the like.

Examples of a commercially available product of the urethane (meth)acrylate-based resin include "SHIKOH UT-4690" and "SHIKOH UT-4692" (manufactured by Nippon Synthetic Chemical Industry Co., Ltd.); and the like.

Examples of the polyester (meth)acrylate-based resins include a compound obtained by esterifying the hydroxyl groups of a polyester oligomer with (meth)acrylic acid, the polyester oligomer being obtained by dehydration and condensation of a polybasic carboxylic acid (anhydride) and a polyol, and having a hydroxyl group at each terminal, a compound obtained by esterifying the terminal hydroxyl group of an oligomer with (meth)acrylic acid, the oligomer being obtained by adding an alkylene oxide to a polycarboxylic acid, and the like. Examples of the polybasic carboxylic acid (anhydride) used to produce the polyester (meth)acrylate-based resin include succinic acid (anhydride), adipic acid, maleic acid (anhydride), itaconic acid (anhydride), trimellitic acid (anhydride), pyromellitic acid (anhydride), hexahydrophthalic acid (anhydride), phthalic acid (anhydride), isophthalic acid, terephthalic acid, and the like. Examples of the polyol include 1,4-butanediol, 1,6-hexanediol, diethylene glycol, triethylene glycol, propylene glycol, dimethylolheptane, trimethylolpropane, pentaerythritol, dipentaerythritol, and the like.

Examples of the epoxy (meth)acrylate-based resins include a compound obtained by reacting (meth)acrylic acid with the oxirane ring of a bisphenol-type epoxy resin or a novolac-type epoxy resin having a relatively low molecular weight to effect esterification, and the like.

Commercially available products of these compounds may be used directly.

Among these, it is preferable to use the urethane (meth) acrylate-based resin as the (meth)acrylate-based resin since adhesion between the base and the gas barrier layer can be improved.

It is preferable that the (meth)acrylate-based resin be an oligomer. The molecular weight of the (meth)acrylate-based resin is preferably 100 to 10,000, more preferably 300 to 5000, and still more preferably 300 to 1000.

An enethiol-based ionizing radiation-curable resin composition may be used together with, or instead of, the (meth)acrylate-based ionizing radiation-curable compound.

The enethiol-based ionizing radiation-curable resin composition includes a compound that includes an ethylenically unsaturated group, and a compound that includes a mercapto group. Examples of the compound that includes an ethylenically unsaturated group include an allyl alcohol derivative, an ester compound of acrylic acid and a polyhydric alcohol, urethane acrylate, divinylbenzene, and the like. Examples of the compound that includes a mercapto group include a polymercaptocarboxylic acid amide compound, an ester of a mercaptocarboxylic acid and a polyhydric alcohol, and the like. Examples of a commercially available product thereof include "OP-1030K" (manufactured by Denki Kagaku Kogyo Kabushiki Kaisha) and the like.

The material for forming the primer layer is preferably a trifunctional (meth)acrylate compound such as ethoxylated isocyanuric acid triacrylate, a hexafunctional (meth)acrylate compound such as dipentaerythritol hexa(meth)acrylate, a urethane (meth)acrylate-based resin, or a combination thereof, and particularly preferably a mixture of a hexafunctional (meth)acrylate compound such as dipentaerythritol hexa(meth)acrylate and a urethane (meth)acrylate-based resin, since a primer layer having the desired modulus of elasticity can be more easily formed, and adhesion between the base and the gas barrier layer can be improved.

When using the ionizing radiation-curable compound, the enethiol-based ionizing radiation-curable resin, and/or a composition that includes the ionizing radiation-curable compound and the enethiol-based ionizing radiation-curable resin, the primer layer may be formed by dissolving or dispersing the ionizing radiation-curable compound or the like and an optional photoinitiator in an appropriate solvent to prepare a primer layer-forming solution, applying the primer layer-forming solution to one side or each side of the base, drying the resulting film, optionally heating the dried film, and applying ionizing radiation to the film to cure the film.

The photoinitiator is not particularly limited. A known compound may be used as the photoinitiator. Examples of the photoinitiator include benzoin compounds such as 2,4, 6-trimethylbenzoyldiphenylphosphine oxide, benzoin, benzoin methyl ether, benzoin ethyl ether, benzoin isopropyl ether, benzoin n-butyl ether, and benzoin isobutyl ether; acetophenone compounds such as acetophenone, dimethylaminoacetophenone, 2,2-dimethoxy-2-phenylacetophenone, and 2,2-diethoxy-2-phenylacetophenone; alpha-hydroxyalkylphenone compounds such as 2-hydroxy-2-methyl-1-phenylpropan-1-one, 1-hydroxycyclohexyl phenyl ketone, 2-methyl-1-[4-(methylthio)phenyl]-2-morpholinopropan-1-one, 4-(2-hydroxyethoxy)phenyl 2-(hydroxyl-2-propyl) ketone, and 2-hydroxy-1-{4-[4-(2-hydroxy-2-methylpropionyl)benzyl]phenyl}-2-methyl-propan-1-one; benzophenone compounds such as benzophenone, p-phenylbenzophenone, 4,4'-diethylaminobenzophenone, and dichlorobenzophenone; anthraquinone compounds such as 2-methylanthraquinone, 2-ethylanthraquinone, 2-t-butylanthraquinone, and 2-aminoanthraquinone; thioxanthone compounds such as 2-methylthioxanthone, 2-ethylthioxanethone, 2-chlorothioxanthone, 2,4-dimethylthioxanethone, and 2,4-diethylthioxanthone; dimethyl ketal compounds such as benzyl dimethyl ketal and acetophenone dimethyl ketal;

p-dimethylaminobenzoates; oligo[2-hydroxy-2-methyl-1-[4-(1-methylvinyl)phenyl]propanone]; and the like.

The photoinitiator is used in a ratio of 0.1 to 7 mass %, and preferably 1 to 5 mass %, based on the solid content in the primer layer-forming solution.

Examples of the solvent include ester-based solvents such as ethyl acetate and propyl acetate; ketone-based solvents such as acetone, methyl ethyl ketone, and methyl isobutyl ketone; aromatic hydrocarbon-based solvents such as benzene and toluene; saturated hydrocarbon-based solvents such as pentane and hexane; mixed solvents of two or more solvents among these solvents; and the like.

The primer layer-forming solution may be applied to the base layer using a known wet coating method. Examples of the wet coating method include a bar coat method, a spin coating method, a dipping method, a roll coating method, a gravure coating method, a knife coating method, an air-knife coating method, a roll knife coating method, a die coating method, a screen printing method, a spray coating method, a gravure offset method, and the like.

The film formed by applying the primer layer-forming solution may be dried using a known drying method (e.g., hot-air drying, heat-roll drying, or infrared irradiation). The heating temperature is normally 60 to 130° C. The heating time is normally several seconds to several tens of minutes.

Ionizing radiation is applied to the resulting dried film. The term "ionizing radiation" used herein refers to electromagnetic waves or charged particle rays that can polymerize and crosslink molecules. Ultraviolet rays or electron beams are normally used as the ionizing radiation. It is particularly preferable to use ultraviolet rays. An ultrahigh-pressure mercury lamp, a high-pressure mercury lamp, a low-pressure mercury lamp, a carbon arc, a black light lamp, a metal halide lamp, a microwave-excited lamp, a chemical lamp, or the like may be used as the UV source. The dose of the ionizing radiation is not particularly limited, but is normally 10 to 1000 mJ/cm$^2$. The irradiation time is normally several seconds to several hours, and the irradiation temperature is normally room temperature to 100° C.

The thickness of the primer layer is preferably 0.5 to 3 μm, and more preferably 1 to 3 μm. When the thickness of the primer layer is within the above range, the arithmetic average roughness (Ra) and the total height (Rt) of the roughness profile of the surface of the gas barrier layer that is formed on the primer layer can be controlled within preferable ranges.

(3) Gas Barrier Layer

The gas barrier laminate according to one embodiment of the invention includes the gas barrier layer that is stacked on the primer layer. The gas barrier layer has a capability to suppress transmission of gas (e.g., oxygen and water vapor) (gas barrier capability). When the gas barrier layer forms the outermost layer of the laminate, the coefficient of static friction between the surface of the gas barrier layer and the surface of the other side of the laminate must be 0.35 to 0.8 (described later).

In this case, the coefficient of static friction is preferably adjusted within the above specific range by forming the gas barrier layer so that the surface of the gas barrier layer has an arithmetic average roughness (Ra) of 8 nm or less and a total height (Rt) of the roughness profile of less than 150 nm.

Examples of the gas barrier layer include a gas barrier layer that is formed of an inorganic deposited (evaporated) film, a gas barrier layer that includes a gas barrier resin, a gas barrier layer obtained by implanting ions into a layer that includes a polymer compound, and the like.

It is preferable that the gas barrier layer be a layer obtained by implanting ions into a layer that includes a polymer compound, since it is possible to efficiently form a layer that exhibits an excellent gas barrier capability, and easily achieve the object of the invention.

The gas barrier layer may be a single layer, or may be a layer in which a plurality of layers are stacked.

Examples of the polymer compound that is used to form the layer that includes a polymer compound include silicon-based polymer compounds, polyimides, polyamides, polyamideimides, polyphenylene ethers, polyether ketones, polyether ether ketones, polyolefins, polyesters, polycarbonates, polysulfones, polyether sulfones, polyphenylene sulfides, polyallylates, acrylic-based resins, cycloolefin-based polymers, aromatic-based polymers, a combination of two or more compounds among these compounds, and the like.

Among these, it is preferable to use a silicon-based polymer compound since an excellent gas barrier capability can be obtained.

A known compound may be used as the silicon-based polymer compound. Examples of the silicon-based polymer compound include a polysilazane compound, a polycarbosilane compound, a polysilane compound, a polyorganosiloxane compound, and the like (see JP-A-10-245436, JP-T-2003-514822, JP-A-2005-36089, JP-A-2008-63586, JP-A-2009-235358, JP-A-2009-286891, JP-A-2010-106100, JP-A-2010-229445, JP-A-2010-232569, and JP-A-2010-238736, for example).

Among these, a polysilazane compound and a polyorganosiloxane compound are preferable as the silicon-based polymer compound since a gas barrier layer that exhibits an excellent gas barrier capability can be easily formed.

The polysilazane compound is a polymer compound that includes a repeating unit represented by —Si—N— in the molecule. A known polysilazane compound such as an organic polysilazane, an inorganic polysilazane, or a modified polysilazane may be used as the polysilazane compound.

Among these, an inorganic polysilazane and an organic polysilazane are preferable, an inorganic polysilazane is more preferable, and a perhydropolysilazane is particularly preferable, from the viewpoint of availability and a capability to form an ion-implanted layer that exhibits an excellent gas barrier capability.

A polysilazane layer (i.e., a layer that includes a polysilazane compound as the silicon-based polymer compound) may be formed by bringing gas of a plasma-polymerizable silazane compound (e.g., dimethyldisilazane, tetramethyldisilazane, or hexamethyldisilazane) into contact with an intermediate layer, and subjecting the resulting product to plasma polymerization (see JP-A-9-143289).

A product commercially available as a glass coating material or the like may be used directly as the polysilazane compound.

The layer that includes the polymer compound may include an additional component other than the polymer compound as long as the object of the invention is not impaired. Examples of the additional component include a curing agent, an additional polymer, an aging preventive, a light stabilizer, a flame retardant, and the like.

The content of the polymer compound in the layer that includes the polymer compound is preferably 50 wt % or more, and more preferably 70 wt % or more, since an ion-implanted layer that exhibits an excellent gas barrier capability can be formed.

The layer that includes the polymer compound may be formed in the same manner as the primer layer using a gas barrier layer-forming composition prepared by dissolving or dispersing the polymer compound and an optional additional component in a solvent.

The thickness of the layer that includes the polymer compound is not particularly limited, but is normally 20 nm to 1 μm, preferably 30 to 500 nm, and more preferably 40 to 200 nm.

According to the embodiments of the invention, a gas barrier laminate that exhibits a sufficient gas barrier capability can be obtained even when the layer that includes the polymer compound has a thickness at a nanometer level.

Examples of the ions to be implanted into the layer that includes the polymer compound include ions of a rare gas (e.g., argon, helium, neon, krypton, and xenon), a fluorocarbon, hydrogen, nitrogen, oxygen, carbon dioxide, chlorine, fluorine, and sulfur; ions of a metal (e.g., gold, silver, copper, platinum, nickel, palladium, chromium, titanium, molybdenum, niobium, tantalum, tungsten, and aluminum); and the like.

Among these, ions of at least one element selected from the group consisting of hydrogen, nitrogen, oxygen, argon, helium, neon, xenon, and krypton is preferable due to ease of implantation and a capability to form an ion-implanted layer that exhibits an excellent gas barrier capability and excellent transparency.

The ion implantation dose may be appropriately determined taking account of the intended use of the gas barrier laminate (e.g., gas barrier capability and transparency), and the like.

The ions may be implanted by applying ions (ion beams) accelerated by an electric field, implanting ions present in plasma (plasma ion implantation method), or the like. It is preferable to use the plasma ion implantation method since a gas barrier layer can be easily obtained.

The plasma ion implantation method may be implemented by generating plasma in an atmosphere including a plasma-generating gas (e.g., rare gas), and implanting ions (cations) present in the plasma into the surface area of the layer that includes the polymer compound by applying a negative high-voltage pulse to the layer that includes the polymer compound, for example.

The thickness of the ion implantation target area may be controlled by adjusting the implantation conditions (e.g., type of ions, applied voltage, and implantation time), and may be determined taking account of the thickness of the layer that includes the polymer compound, the intended use of the gas barrier laminate, and the like. The thickness of the ion implantation target area is normally 10 to 1000 nm.

Whether or not ions have been implanted may be determined by performing elemental analysis on an area up to a depth of about 10 nm from the surface using X-ray photoelectron spectroscopy (XPS).

The thickness of the gas barrier layer is not particularly limited, but is normally 20 nm to 1 μm, preferably 30 to 500 nm, and more preferably 40 to 200 nm.

According to the embodiments of the invention, a gas barrier laminate that exhibits a sufficient gas barrier capability can be obtained even when the gas barrier layer has a thickness at a nanometer level.

(4) Gas Barrier Laminate

The gas barrier laminate according to one embodiment of the invention has a layer structure in which the primer layer and the gas barrier layer are sequentially stacked on at least one side of the base. The gas barrier laminate may have a layer structure in which the primer layer and the gas barrier layer are sequentially stacked on one side of the base (base/primer layer/gas barrier layer), or may have a layer structure in which the primer layer and the gas barrier layer are sequentially stacked on each side of the base (gas barrier layer/primer layer/base/primer layer/gas barrier layer). The gas barrier laminate may include an additional layer in addition to the base, the primer layer, and the gas barrier layer. Examples of the additional layer include a protective layer, a conductive layer, a protective sheet, a pressure-sensitive adhesive layer, a release sheet, and the like. When the gas barrier laminate according to one embodiment of the invention includes the additional layer, the gas barrier laminate may have a layer structure "base/primer layer/gas barrier layer/protective layer", "base/primer layer/gas barrier layer/conductive layer", "base/primer layer/gas barrier layer/protective sheet", "conductive layer/base/primer layer/gas barrier layer", "protective layer/base/primer layer/gas barrier layer", or the like. It is preferable that one outermost layer of the gas barrier laminate is the gas barrier layer, and the other outermost layer of the gas barrier laminate is the base.

Note that the coefficient of static friction between the surface of one side of the laminate and the surface of the other side of the laminate must be within the specific range.

The gas barrier laminate according to one embodiment of the invention has a configuration in which the coefficient of static friction between the surface of one side of the gas barrier laminate and the surface of the other side of the gas barrier laminate is 0.35 to 0.8, preferably 0.35 to 0.65, and particularly preferably 0.40 to 0.60. When the coefficient of static friction is within the above range, an appropriate sliding capability can be obtained. In particular, when the laminate is a long film, winding failure (e.g., blocking and wrinkles) does not occur, and an excellent winding capability can be achieved when winding the laminate.

Note that the coefficient of static friction refers to a value measured in accordance with JIS K 7125.

The coefficient of static friction between the surface of one side of the gas barrier laminate and the surface of the other side of the gas barrier laminate may be adjusted to 0.35 to 0.8 using an arbitrary method. This may be achieved empirically. For example, it is preferable that the surface of one side of the gas barrier laminate where the primer layer and the gas barrier layer are stacked have an arithmetic average roughness (Ra) of 8 nm or less and a total height (Rt) of the roughness profile of less than 150 nm, and the surface of the other side of the gas barrier laminate have an arithmetic average roughness (Ra) of 15 nm or more and a total height (Rt) of the roughness profile of 150 nm or more.

Specifically, when the gas barrier layer forms the outermost layer of the laminate (e.g., (base/primer layer/gas barrier layer), (gas barrier layer/primer layer/base/primer layer/gas barrier layer), (conductive layer/base/primer layer/gas barrier layer), or (protective layer/base/primer layer/gas barrier layer)), the coefficient of static friction between the surface of the gas barrier layer and the surface of the other side of the laminate may be adjusted to 0.35 to 0.8 by forming the gas barrier layer so that the surface of the gas barrier layer has an arithmetic average roughness (Ra) of 8 nm or less and a total height (Rt) of the roughness profile of less than 150 nm. Note that the surface of the gas barrier layer refers to the surface of the gas barrier layer that is situated opposite to the base in the laminate. The surface of the gas barrier layer may be controlled by forming the gas barrier layer on the primer layer for which the thickness is appropriately adjusted within the range of 1 to 3 μm, for example.

When providing an additional layer such as a conductive layer on the gas barrier layer (e.g., (base/primer layer/gas barrier layer/conductive layer)), the additional layer such as a conductive layer may be formed to have a total height (Rt) of the roughness profile of less than 150 nm.

The surface of the other side of the gas barrier laminate may be formed to have an arithmetic average roughness (Ra) of 15 nm or more and a total height (Rt) of the roughness profile of 150 nm or more by selecting a base having an arithmetic average roughness (Ra) of 15 nm or more and a total height (Rt) of the roughness profile of 150 nm or more, for example.

The surface of the base may be subjected to a surface roughening treatment to adjust the roughness and the like. Examples of the surface roughening method include a corona discharge method, a surface treatment method that utilizes an antiblocking agent to which a filler is added, and the like.

An additional layer may be formed on the side of the base opposite to the side on which the primer layer and the gas barrier layer are stacked so that the surface of the additional layer has an arithmetic average roughness (Ra) of 15 nm or more and a total height (Rt) of the roughness profile of 150 nm or more.

Note that the arithmetic average roughness (Ra) and the total height (Rt) of the roughness profile may be measured by a known method using an optical interference microscope or the like, for example.

The gas barrier laminate according to one embodiment of the invention exhibits an excellent gas barrier capability. The gas barrier laminate according to one embodiment of the invention exhibits an excellent gas barrier capability since the gas barrier laminate has a low water vapor transmission rate, for example. The gas barrier laminate preferably has a water vapor transmission rate of 0.1 g/m$^2$/day or less, and more preferably 0.05 g/m$^2$/day or less. The gas (e.g., water vapor) transmission rate may be measured using a known gas transmission rate measurement device.

The gas barrier laminate according to one embodiment of the invention exhibits excellent durability. The gas barrier laminate according to one embodiment of the invention exhibits excellent durability since the gas barrier capability deteriorates to only a small extent even when gas barrier laminate is subjected to a high temperature and a high humidity for a long time, for example. For example, the water vapor transmission rate increase ratio when the gas barrier laminate is allowed to stand at a temperature of 60° C. and a relative humidity of 90% for 150 hours is preferably 60% or less, more preferably 10% or less, and still more preferably 5% or less.

It is preferable that the gas barrier laminate according to one embodiment of the invention be a long laminate film (sheet). In this case, the advantageous effects of the invention can be more easily achieved.

The thickness of the laminate film may be appropriately determined taking account of the intended use of the gas barrier laminate.

2) Method for Producing Gas Barrier Laminate

The gas barrier laminate according to one embodiment of the invention may be produced by forming a primer layer having a modulus of elasticity at 90° C. of 1.6 GPa or more on at least one side of a specific base, and forming a specific gas barrier layer on the primer layer so that the coefficient of static friction between the surface of one side of the laminate and the surface of the other side of the laminate is 0.35 to 0.8.

It is preferable to produce the gas barrier laminate using a method for producing a long gas barrier laminate that includes the following steps, since the advantageous effects of the invention can be more easily achieved.

Step (I): A step that forms a gas barrier layer on a primer layer while feeding a long base in a given direction, the primer layer being formed on at least one side of the base, and having a modulus of elasticity at 90° C. of 1.6 GPa or more.

Step (II): A step that rolls up the base on which the gas barrier layer is formed.

It is preferable to perform the step (I) and the step (II) while feeding the long base using a roll-to-roll method.

An example in which a long gas barrier laminate according to one embodiment of the invention that has a three-layer (base/primer layer/gas barrier layer) structure is produced is described below with reference to FIG. 1.

Figure 1:
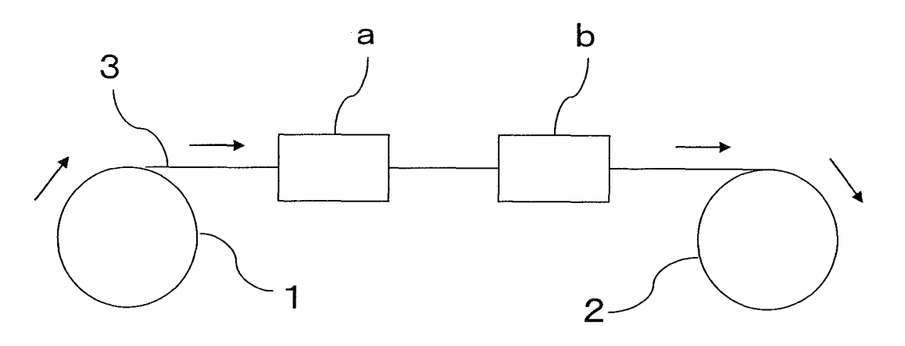
FIG. 1 is a schematic view illustrating an apparatus used for a production process according to one embodiment of the invention.

FIG. 1 is a schematic view illustrating an apparatus used for the production process according to one embodiment of the invention. In FIG. 1, reference sign 1 indicates a feed-out roll, reference sign 2 indicates a wind-up roll, reference sign 3 indicates a long base, a primer layer having a modulus of elasticity at 90° C. of 1.6 GPa or more being formed on at least one side of the base (hereinafter may be referred to as "base provided with the primer layer"), reference sign a indicates a means that forms a layer that includes a polymer compound, and reference sign b indicates an ion implantation means.

A film formed of an arbitrary resin among the resins mentioned above as the material for forming the base is preferably used as the long base.

The base provided with the primer layer may be obtained by applying the primer layer-forming solution to the long base using a known method, drying the resulting film, and applying ionizing radiation to the dried film to cure the film to form a primer layer having a modulus of elasticity at 90° C. of 1.6 GPa or more, for example.

In the step (I), a layer that includes a polymer compound is formed on the primer layer using the means a while feeding the base 3 provided with the primer layer in a given direction (see FIG. 1).

Ions are implanted into the surface area of the layer that includes a polymer compound using the ion implantation means b. It is preferable to implant ions using the plasma ion implantation method.

In the step (II), the base 3 on which the primer layer and the gas barrier layer are sequentially stacked is rolled up using the wind-up roll 2 (i.e., wound around the wind-up roll 2).

A laminate that is formed so that the coefficient of static friction between the surface of one side of the laminate and the surface of the other side of the laminate is 0.35 to 0.8 is produced by appropriately selecting the base, the primer layer-forming composition, the polymer compound, and the like, and controlling the thickness and the surface roughness, for example. Therefore, it is possible to efficiently and continuously mass-produce a gas barrier laminate film that exhibits an excellent gas barrier capability and excellent durability, and does not show winding failure (e.g., blocking and wrinkles) during winding.

3) Electronic Device Member and Electronic Device

An electronic device member according to one embodiment of the invention includes the gas barrier laminate according to one embodiment of the invention. Therefore, the electronic device member according to one embodiment of the invention exhibits an excellent gas barrier capability, and prevents a deterioration in an element due to gas (e.g., water vapor). Since the electronic device member exhibits excellent durability, the electronic device member may suitably be used as a display member for liquid crystal displays, EL displays, and the like; a solar cell back side protective sheet; and the like.

An electronic device according to one embodiment of the invention includes the electronic device member according to one embodiment of the invention. Specific examples of the electronic device include a liquid crystal display, an organic EL display, an inorganic EL display, electronic paper, a solar cell, and the like.

Since the electronic device according to one embodiment of the invention includes the electronic device member that includes the gas barrier laminate according to one embodiment of the invention, the electronic device exhibits an excellent gas barrier capability and excellent durability.

EXAMPLES

The invention is further described below by way of examples. Note that the invention is not limited to the following examples.

A primer layer-forming solution (primer layer-forming solutions A to I) was prepared as described below.

Preparation of Primer Layer-Forming Solution A 20 parts by mass of dipentaerythritol hexaacrylate ("A-DPH" manufactured by Shin-Nakamura Chemical Co., Ltd. (hereinafter the same)) ((meth)acrylate-based ionizing radiation-curable compound) was dissolved in 100 parts by mass of methyl isobutyl ketone. 3 parts by mass (based on 100 parts by mass of the solid included in the primer layer-forming solution) of a photoinitiator ("Irgacure 127" manufactured by BASF) was added to the solution to prepare a primer layer-forming solution A.

Preparation of Primer Layer-Forming Solution B

A primer layer-forming solution B was prepared in the same manner as the primer layer-forming solution A, except that 20 parts by mass of a urethane (meth)acrylate-based resin ("SHIKOH UT-4690" manufactured by Nippon Synthetic Chemical Industry Co., Ltd.) was used instead of 20 parts by mass of dipentaerythritol hexaacrylate.

Preparation of Primer Layer-Forming Solution C

A primer layer-forming solution C was prepared in the same manner as the primer layer-forming solution A, except that 20 parts by mass of a mixture (mass ratio: 1:1) of dipentaerythritol hexaacrylate and a urethane (meth)acrylate-based resin ("SHIKOH UT-4690" manufactured by Nippon Synthetic Chemical Industry Co., Ltd.) was used instead of 20 parts by mass of dipentaerythritol hexaacrylate.

Preparation of Primer Layer-Forming Solution D

A primer layer-forming solution D was prepared in the same manner as the primer layer-forming solution A, except that 20 parts by mass of ethoxylated isocyanuric acid triacrylate ("A-9300" manufactured by Shin-Nakamura Chemical Co., Ltd. (hereinafter the same)) was used instead of 20 parts by mass of dipentaerythritol hexaacrylate.

Preparation of Primer Layer-Forming Solution E

A primer layer-forming solution E was prepared in the same manner as the primer layer-forming solution A, except that 20 parts by mass of a mixture (mass ratio: 1:1) of ethoxylated isocyanuric acid triacrylate and a urethane acrylate-based UV-curable compound ("SHIKOH UT-4690" manufactured by Nippon Synthetic Chemical Industry Co., Ltd.) was used instead of 20 parts by mass of dipentaerythritol hexaacrylate.

Preparation of Primer Layer-Forming Solution F

A primer layer-forming solution F was prepared in the same manner as the primer layer-forming solution A, except that 20 parts by mass of a mixture (mass ratio: 1:1) of dipentaerythritol hexaacrylate and a urethane acrylate-based UV-curable compound ("SHIKOH UT-4692" manufactured by Nippon Synthetic Chemical Industry Co., Ltd.) was used instead of 20 parts by mass of dipentaerythritol hexaacrylate.

Preparation of Primer Layer-Forming Solution G

A primer layer-forming solution G was prepared in the same manner as the primer layer-forming solution A, except that 20 parts by mass of a urethane acrylate-based UV-curable compound ("SHIKOH UT-4692" manufactured by Nippon Synthetic Chemical Industry Co., Ltd.) was used instead of 20 parts by mass of dipentaerythritol hexaacrylate.

Preparation of Primer Layer-Forming Solution H

A primer layer-forming solution H was prepared in the same manner as the primer layer-forming solution A, except that 20 parts by mass of a urethane acrylate-based UV-curable compound ("SHIKOH UT-4695" manufactured by Nippon Synthetic Chemical Industry Co., Ltd.) was used instead of 20 parts by mass of dipentaerythritol hexaacrylate.

Preparation of Primer Layer-Forming Solution I

A primer layer-forming solution I was prepared in the same manner as the primer layer-forming solution A, except that 20 parts by mass of a urethane acrylate-based UV-curable compound ("SHIKOH UT-4697" manufactured by Nippon Synthetic Chemical Industry Co., Ltd.) was used instead of 20 parts by mass of dipentaerythritol hexaacrylate.

Preparation of Primer Layer-Forming Solution J

A primer layer-forming solution J was prepared in the same manner as the primer layer-forming solution A, except that 20 parts by mass of tricyclodecanedimethanol diacrylate ("A-DCP" manufactured by Shin-Nakamura Chemical Co., Ltd.) was used instead of 20 parts by mass of dipentaerythritol hexaacrylate.

Example 1

The primer layer-forming solution A was applied to a PET film ("PET25 T-100" manufactured by Mitsubishi Plastics, Inc., thickness: 25 µm, hereinafter referred to as "PET film A") using a bar coater, and heated (dried) at 70° C. for 1 minute. UV rays were applied to the primer layer-forming solution A (high-pressure mercury lamp, line speed: 20 m/min, cumulative intensity: 100 mJ/cm$^2$, peak intensity 1.466 W, pass count: 2) using a UV-ray irradiation line to form a primer layer having a thickness of 1 µm.

The modulus of elasticity of the primer layer at 90° C. was 3.59 GPa.

The modulus of elasticity was measured using the following method.

Modulus of Elasticity

The modulus of elasticity (GPa) of the surface of the primer layer at 25° C., 60° C., and 90° C. was measured by a nanoindentation method using a nanohardness tester ("DUH-W201-S" manufactured by Shimadzu Corporation). The measurement results are shown in Table 1.

A perhydropolysilazane ("AZNL110A-20" manufactured by AZ Electronic Materials) was spin-coated onto the primer layer, and heated at 120° C. for 2 minutes to form a perhydropolysilazane layer (thickness: 150 nm) on the primer layer. Argon (Ar) ions were implanted into the surface of the perhydropolysilazane layer using a plasma ion implantation apparatus to obtain a laminate 1.

The plasma ion implantation was performed using the following apparatus under the following conditions.
Plasma Ion Implantation Apparatus
RF power supply: "RF56000" manufactured by JEOL Ltd.
High-voltage pulse power supply: "PV-3-HSHV-0835" manufactured by Kurita Seisakusho Co., Ltd.
Plasma Ion Implantation Conditions
Plasma-generating gas: Ar
Gas flow rate: 100 sccm
Duty ratio: 0.5%
Repetition frequency: 1000 Hz
Applied voltage: −10 kV
RF power supply: frequency: 13.56 MHz, applied electric power: 1000 W
Chamber internal pressure: 0.2 Pa
Pulse width: 5 μsec
Treatment time (ion implantation time): 5 min
Line (feed) speed: 0.2 m/m in Example 2

A laminate 2 was produced in the same manner as in Example 1, except that the primer layer-forming solution B was used instead of the primer layer-forming solution A.

Example 3

A laminate 3 was produced in the same manner as in Example 1, except that the primer layer-forming solution C was used instead of the primer layer-forming solution A.

Example 4

A laminate 4 was produced in the same manner as in Example 1, except that the primer layer-forming solution D was used instead of the primer layer-forming solution A.

Example 5

A laminate 5 was produced in the same manner as in Example 1, except that the primer layer-forming solution E was used instead of the primer layer-forming solution A.

Example 6

A laminate 6 was produced in the same manner as in Example 1, except that the primer layer-forming solution F was used instead of the primer layer-forming solution A.

Example 7

A laminate 7 was produced in the same manner as in Example 1, except that a layer including a polyorganosiloxane-based compound was formed on the primer layer instead of the perhydropolysilazane layer. The layer including a polyorganosiloxane-based compound was formed by mixing 2.72 parts by mass of methyltrimethoxysilane (manufactured by Tokyo Kasei Kogyo Co., Ltd.), 20 ml of toluene, 10 ml of distilled water, and 0.10 parts by mass of phosphoric acid (manufactured by Kanto Kagaku Co., Ltd.), reacting the mixture at room temperature for 24 hours, spin-coating the resulting polyorganosiloxane-based compound onto the primer layer, and heating the resulting film at 120° C. for 2 minutes.

Example 8

A laminate 8 was produced in the same manner as in Example 1, except that a PET film "PET25 Lumirror R-56" (manufactured by Toray Industries Inc., thickness: 25 μm, hereinafter referred to as "PET film B") was used instead of the PET film A.

Comparative Example 1

A laminate 1r was produced in the same manner as in Example 1, except that the primer layer-forming solution G was used instead of the primer layer-forming solution A.

Comparative Example 2

A laminate 2r was produced in the same manner as in Example 1, except that the primer layer-forming solution H was used instead of the primer layer-forming solution A.

Comparative Example 3

A laminate 3r was produced in the same manner as in Example 1, except that the primer layer-forming solution I was used instead of the primer layer-forming solution A.

Comparative Example 4

A laminate 4r was produced in the same manner as in Example 1, except that the primer layer-forming solution J was used instead of the primer layer-forming solution A.

Comparative Example 5

A laminate 5r was produced in the same manner as in Example 5, except that the PET film B was used instead of the PET film A.

Comparative Example 6

A laminate 6r was produced in the same manner as in Example 1, except that a PET film "PET25T-702" (manufactured by Mitsubishi Plastics Inc., thickness: 25 μm, hereinafter referred to as "PET film C") was used instead of the PET film A.

Comparative Example 7

A laminate 7r was produced in the same manner as in Example 1, except that a PET film "PET25 Tetoron HPE" (manufactured by Teijin DuPont Films Japan Limited, thickness: 25 μm, hereinafter referred to as "PET film D") was used instead of the PET film A.

The water vapor transmission rate of the laminates 1 to 7 obtained in Examples 1 to 7 and the laminates 1r to 7r obtained in Comparative Examples 1 to 7 was measured as described below.
Measurement of Water Vapor Transmission Rate The water vapor transmission rate (g/m$^2$/day) was measured using a water vapor transmission rate measurement device ("PERMATRAN" manufactured by MOCON) before and after subjecting the laminate to a durability test in which the laminate was allowed to stand at a temperature of 60° C. and a relative humidity of 90% for 150 hours. The water vapor transmission rate increase ratio due to the durability test was calculated by the following expression. The durability was evaluated as "Excellent (A)" when the increase ratio was less than 10%, evaluated as "Good (B)" when the increase ratio was 10% or more and less than 60%, and evaluated as "Poor (C)" when the increase ratio was 60% or more. The evaluation results are shown in Table 1.

Increase ratio=(water vapor transmission rate after durability test−water vapor transmission rate before durability test)/(water vapor transmission rate before durability test)×100

The arithmetic average roughness (Ra) and the total height (Rt) of the roughness profile of the surface (i.e., the surface of the gas barrier layer) of one side of the gas barrier laminate (laminates 1 to 8 obtained in Examples 1 to 8 and laminates 1r to 7r obtained in Comparative Examples 1 to 7), and the surface (i.e., the surface of the base) of the other side of the gas barrier laminate were measured using an optical interference microscope ("NT8000" manufactured by Veeco), and the coefficient of static friction between the surface of the gas barrier layer and the surface of the base was measured in accordance with JIS K 7125. The measurement results are shown in Table 1.

The winding capability was evaluated as "Acceptable (A)" when blocking and wrinkles did not occur when rolling up the laminate, evaluated as "Fair (B)" when blocking or wrinkles occurred to only a small extent when rolling up the laminate, and evaluated as "Unacceptable (C)" when blocking or wrinkles occurred when rolling up the laminate. The evaluation results are shown in Table 1.

TABLE 1

|  | Laminate | Gas barrier layer | Base | Primer layer Type | Modulus of elasticity 25° C. | 60° C. | 90° C. | Water vapor transmission rate (g/m²/day) Before test | After test |
|---|---|---|---|---|---|---|---|---|---|
| Example 1 | 1 | A | A | A | 4.48 | 4.06 | 3.59 | 0.025 | 0.027 |
| Example 2 | 2 | A | A | B | 4.45 | 3.92 | 3.31 | 0.023 | 0.024 |
| Example 3 | 3 | A | A | C | 3.33 | 3.34 | 3.12 | 0.024 | 0.025 |
| Example 4 | 4 | A | A | D | 3.39 | 3.24 | 3.12 | 0.021 | 0.025 |
| Example 5 | 5 | A | A | E | 3.40 | 3.20 | 3.10 | 0.025 | 0.026 |
| Example 6 | 6 | A | A | F | 3.21 | 2.31 | 2.01 | 0.023 | 0.035 |
| Example 7 | 7 | B | A | A | 4.48 | 4.06 | 3.59 | 0.077 | 0.084 |
| Example 8 | 8 | A | B | A | 4.48 | 4.06 | 3.59 | 0.025 | 0.027 |
| Comparative Example 1 | 1r | A | A | G | 3.35 | 2.57 | 1.53 | 0.025 | 0.052 |
| Comparative Example 2 | 2r | A | A | H | 2.11 | 1.05 | 0.80 | 0.025 | 0.049 |
| Comparative Example 3 | 3r | A | A | I | 2.50 | 1.10 | 1.10 | 0.025 | 0.053 |
| Comparative Example 4 | 4r | A | A | J | 1.90 | 1.30 | 1.10 | 0.025 | 0.066 |
| Comparative Example 5 | 5r | A | B | E | 3.40 | 3.20 | 3.10 | 0.025 | 0.026 |
| Comparative Example 6 | 6r | A | C | A | 4.48 | 4.06 | 3.59 | 0.024 | 0.027 |
| Comparative Example 7 | 7r | A | D | A | 4.48 | 4.06 | 3.59 | 0.023 | 0.027 |

|  | Increase ratio (%) | Durability | Surface roughness (nm) Surface of gas barrier layer Ra | Rt | Surface of base Ra | Rt | Coefficient of static friction | winding capability |
|---|---|---|---|---|---|---|---|---|
| Example 1 | 8.0 | A | 3.5 | 80 | 24 | 750 | 0.41 | A |
| Example 2 | 4.3 | A | 2.8 | 89 | 24 | 750 | 0.42 | A |
| Example 3 | 4.2 | A | 3.2 | 82 | 24 | 750 | 0.43 | A |
| Example 4 | 19.0 | B | 3.1 | 90 | 24 | 750 | 0.45 | A |
| Example 5 | 4.0 | A | 6.5 | 131 | 24 | 750 | 0.41 | A |
| Example 6 | 52.2 | B | 3.3 | 85 | 24 | 750 | 0.41 | A |
| Example 7 | 9.1 | A | 3.6 | 81 | 24 | 750 | 0.41 | A |
| Example 8 | 8.0 | A | 3.2 | 77 | 21 | 493 | 0.61 | B |
| Comparative Example 1 | 108 | C | 3.5 | 81 | 24 | 750 | 0.40 | A |
| Comparative Example 2 | 96.0 | C | 3.6 | 83 | 24 | 750 | 0.41 | A |
| Comparative Example 3 | 112 | C | 3.8 | 82 | 24 | 750 | 0.41 | A |
| Comparative Example 4 | 164 | C | 3.9 | 81 | 24 | 750 | 0.50 | A |
| Comparative Example 5 | 4.0 | A | 6.5 | 131 | 13 | 207 | 1.00 | C |
| Comparative Example 6 | 12.5 | B | 3.2 | 75 | 13 | 207 | 1.90 | C |
| Comparative Example 7 | 17.4 | B | 2.1 | 55 | 11 | 206 | 2.81 | C |

As shown in Table 1, the laminates of Examples 1 to 8 in which the primer layer had a modulus of elasticity at 90° C. of 1.6 GPa or more, and the coefficient of static friction between the surface (i.e., the surface of the gas barrier layer) of one side of the laminate and the surface (i.e., the surface of the base) of the other side of the laminate was 0.35 to 0.8, had a water vapor transmission rate increase ratio due to the durability test of 53% or less (i.e., exhibited excellent durability), and also exhibited an excellent winding capability.

On the other hand, the laminates of Comparative Examples 1 to 4 in which the primer layer had a modulus of elasticity at 90° C. of less than 1.6 GPa, had a high water vapor transmission rate increase ratio due to the durability test (i.e., exhibited poor durability). The laminates of Comparative Examples 5 to 7 in which the coefficient of static friction was more than 0.8, exhibited a poor winding capability.

REFERENCE SIGNS LIST

1: feed-out roll, 2: wind-up roll, 3: base, a: means that forms layer that includes polymer compound, b: ion implantation means

The invention claimed is:

1. A gas barrier laminate consisting of a base, a primer layer, and a single gas barrier layer, the primer layer and the gas barrier layer being sequentially stacked on at least one side of the base,
wherein a material for forming the primer layer is a (meth)acrylate-based monomer or a combination of a (meth)acrylate-based monomer and a (meth)acrylate-based resin,
the (meth)acrylate-based monomer being selected from the group consisting of a trifunctional (meth)acrylate compound, a tetrafunctional (meth)acrylate compound, a pentafunctional (meth)acrylate compound, and a hexafunctional (meth)acrylate compound,
the (meth)acrylate-based resin being selected from the group consisting of an urethane (meth)acrylate-based resin, a polyester (meth)acrylate-based resin, and an epoxy (meth)acrylate-based resin,
wherein the primer layer has a modulus of elasticity at 90° C. of 1.6 GPa or more, and at 25° C. of 3.2 GPa or more,
wherein the primer layer has a thickness of 0.5 to 3 μm, and
wherein a coefficient of static friction between a surface of one side of the gas barrier laminate and a surface of the other side of the gas barrier laminate is 0.35 to 0.8,
wherein a layer structure of the gas barrier laminate is "base/primer layer/gas barrier layer".

2. The gas barrier laminate according to claim 1,
wherein a surface of one side of the gas barrier laminate where the primer layer and the gas barrier layer are stacked has an arithmetic average roughness (Ra) of 8 nm or less and a total height (Rt) of a roughness profile of less than 150 nm, and
a surface of the other side of the gas barrier laminate has an arithmetic average roughness (Ra) of 15 nm or more and a total height (Rt) of a roughness profile of 150 nm or more.

3. The gas barrier laminate according to claim 1, wherein the primer layer is a layer obtained by curing the material for forming the primer layer.

4. The gas barrier laminate according to claim 1, wherein the gas barrier layer is a layer obtained by implanting ions into a layer of a silicon-based polymer compound.

5. The gas barrier laminate according to claim 4, wherein the layer of the silicon-based polymer compound includes a polysilazane compound or a polyorganosiloxane compound.

6. The gas barrier laminate according to claim 1, the gas barrier laminate being a laminate film.

7. The gas barrier laminate according to claim 1, wherein a surface of the gas barrier layer has an arithmetic average roughness (Ra) of 8 nm or less and a total height (Rt) of a roughness profile of less than 150 nm.

8. The gas barrier laminate according to claim 1, wherein a surface of the base has an arithmetic average roughness (Ra) of 15 nm or more and a total height (Rt) of a roughness profile of 150 nm or more.

9. A method for producing the gas barrier laminate according to claim 1, the method comprising:
a step (I) that forms a gas barrier layer on a primer layer while feeding a long base in a given direction, the primer layer being formed on at least one side of the base, and having a modulus of elasticity at 90° C. of 1.6 GPa or more; and
a step (II) that rolls up the base on which the gas barrier layer is formed.

10. An electronic device member comprising the gas barrier laminate according to claim 1.

11. An electronic device comprising the electronic device member according to claim 10.

12. A method for producing the gas barrier laminate according to claim 2, the method comprising:
a step (I) that forms a gas barrier layer on a primer layer while feeding a long base in a given direction, the primer layer being formed on at least one side of the base, and having a modulus of elasticity at 90° C. of 1.6 GPa or more; and
a step (II) that rolls up the base on which the gas barrier layer is formed.

13. A method for producing the gas barrier laminate according to claim 3, the method comprising:
a step (I) that forms a gas barrier layer on a primer layer while feeding a long base in a given direction, the primer layer being formed on at least one side of the base, and having a modulus of elasticity at 90° C. of 1.6 GPa or more; and
a step (II) that rolls up the base on which the gas barrier layer is formed.

14. A method for producing the gas barrier laminate according to claim 4, the method comprising:
a step (I) that forms a gas barrier layer on a primer layer while feeding a long base in a given direction, the primer layer being formed on at least one side of the base, and having a modulus of elasticity at 90° C. of 1.6 GPa or more; and
a step (II) that rolls up the base on which the gas barrier layer is formed.

15. A method for producing the gas barrier laminate according to claim 5, the method comprising:
a step (I) that forms a gas barrier layer on a primer layer while feeding a long base in a given direction, the primer layer being formed on at least one side of the base, and having a modulus of elasticity at 90° C. of 1.6 GPa or more; and
a step (II) that rolls up the base on which the gas barrier layer is formed.

16. A method for producing the gas barrier laminate according to claim 6, the method comprising:

a step (I) that forms a gas barrier layer on a primer layer while feeding a long base in a given direction, the primer layer being formed on at least one side of the base, and having a modulus of elasticity at 90° C. of 1.6 GPa or more; and a step (II) that rolls up the base on which the gas barrier layer is formed.

* * * * *